United States Patent
Nishimura

(10) Patent No.: US 8,653,872 B2
(45) Date of Patent: Feb. 18, 2014

(54) RESET CIRCUIT

(75) Inventor: Shoichiro Nishimura, Osaka (JP)

(73) Assignee: Funai Electric Co., Ltd., Daito-shi, Osaka (JP)

( * ) Notice: Subject to any disclaimer, the term of this patent is extended or adjusted under 35 U.S.C. 154(b) by 148 days.

(21) Appl. No.: 13/449,303

(22) Filed: Apr. 17, 2012

(65) Prior Publication Data
US 2012/0299628 A1    Nov. 29, 2012

(30) Foreign Application Priority Data
May 24, 2011  (JP) .................................. 2011-115588

(51) Int. Cl.
*H03K 3/02*      (2006.01)
(52) U.S. Cl.
USPC ............................................ 327/198; 327/143
(58) Field of Classification Search
USPC .......................................... 327/142, 143, 198
See application file for complete search history.

(56) References Cited

U.S. PATENT DOCUMENTS

| 5,543,741 A * | 8/1996 | Purits .............................. 327/143 |
| 6,259,287 B1 * | 7/2001 | Macks ............................ 327/143 |

FOREIGN PATENT DOCUMENTS

| JP | H10-293142 A | 11/1998 |
| JP | 2008-219658 A | 9/2008 |
| JP | 2010-186336 A | 8/2010 |

* cited by examiner

*Primary Examiner* — Lincoln Donovan
*Assistant Examiner* — Diana J Cheng
(74) *Attorney, Agent, or Firm* — Yokoi & Co., U.S.A., Inc.; Toshiyuki Yokoi

(57) ABSTRACT

The present invention discloses a reset circuit that has a reset IC 12 having a terminal 2 connected to a reset terminal of the microcomputer 30 that is driven by a constant voltage (3.3V) generated by regulating a rectified voltage (V+) by a regulator 24, and a terminal 4 that inputs the constant voltage (3.3V) thorough a register R1, and outputs a reset signal to the microcomputer 30 when an input voltage input to the terminal 4 is lower than a first threshold value; and a transistor Q1 in which a collector is connected to the terminal 4 through a resistor 2 and an emitter is connected to the ground and the transistor is turned on when an output voltage of the switching transformer 21 is lower than a predetermined level, wherein the voltage lower than the first threshold value is input to the terminal 4 when the transistor Q1 is turned on.

3 Claims, 2 Drawing Sheets

RESET CIRCUIT

CROSS-REFERENCES TO RELATED APPLICATIONS

The present application is related to the Japanese Patent Application No. 2011-115590, filed May 24, 2011, the entire disclosure of which is expressly incorporated by reference herein.

BACKGROUND OF THE INVENTION

1. Field of the Invention

The present invention is related to a reset circuit, especially a reset circuit of a microcomputer to which a drive voltage is supplied from a switching power circuit that executes feedback control.

2. Description of the Related Art

In an electronic device, a power supply status is easily changed. Therefore, in order to drive the electronic device correctly, a microcomputer to control the electronic device should be surely reset when the power supply of the electronic device is reduced. Japanese Patent Application Publication No. 2010-186336 discloses a technology in which a control microcomputer driven by a secondary voltage of a DC/DC converter is switched to reset state by a power control computer when a voltage detection circuit detects a reduction of the power supply. Japanese Patent Application Publication No. H10-293142 discloses a technology of a microcomputer that is supplied power from a battery and can detect the voltage of the battery by the microcomputer itself. Japanese Patent Application Publication No. 2008-219658 discloses a technology of a microcomputer that outputs a signal to turn off a power supply circuit when the microcomputer detects reduced voltage state for a certain period.

In the above described conventional reset circuits, a microcomputer plays a certain role when detecting the reduction of the power supply. Therefore, there is a problem of reliability as to a timing when the microcomputer is reset.

BRIEF SUMMARY OF THE INVENTION

The present invention provides a reset circuit to reset the microcomputer certainly by detecting a reduction of power supply.

One aspect of the present invention provides a reset circuit of a microcomputer to which a drive voltage is supplied from a switching power circuit that executes feedback control to stabilize a positive first rectified voltage generated by rectifying an output voltage of a switching transformer, comprising:

a reset IC (Integrated Circuit) that has;

a reset signal output terminal that is connected to a reset terminal of the microcomputer that is driven by a constant voltage generated by regulating the first rectified voltage by a regulator, and a voltage detection terminal that inputs the constant voltage thorough a first register, and outputs a reset signal to the microcomputer when an input voltage input to the voltage detection terminal is lower than a predetermined value, an NPN type transistor in which a collector is connected to the voltage detection terminal through a second resistor and an emitter is connected to the ground, and the transistor is turned on when an output voltage of the switching transformer is lower than a predetermined level, wherein the voltage lower than the predetermined value is input to the voltage detection terminal when the transistor is turned on, and the voltage equal to or higher than the predetermined value is input to the voltage detection terminal when the transistor is turned off.

The above described reset circuit can also be achieved in various ways, by being built into another device or by being executed together with other methods, for example According to the aspect above, a reset circuit for surely resetting a microcomputer can be provided by detecting the reduced voltage state.

DETAILED DESCRIPTION OF THE INVENTION

Another aspect of the present invention provides:

a rectifier circuit that generates a second rectified voltage by rectifying a negative output voltage of the switching transformer, a Zener diode in which the second rectified voltage is input to an anode and a cathode is connected to a base of the transistor thorough a third resistor, and a fourth register that is connected between the base of the transistor and a transfer line of the first rectified voltage, wherein the Zener diode breaks down when the output voltage of the switching transformer is equal to or higher than the predetermined level, and the Zener diode doesn't break down when the output voltage of the switching transformer is lower than the predetermined level, and a voltage that can turn on the transistor is input to the base of the transistor when the Zener diode doesn't break down.

According to the aspect above, the microcomputer can be surely reset before the drive voltage of the microcomputer generated from the positive rectified voltage is reduced by detecting the reduced voltage state using the negative rectified voltage.

Another aspect of the present invention provides the reset IC has a delay circuit that delays the timing to output the reset signal from the reset signal output terminal.

According to the aspect above, chattering doesn't occur in the reset signal output from reset IC.

An embodiment of the present invention will be described below with reference to drawings.

Figure 1:
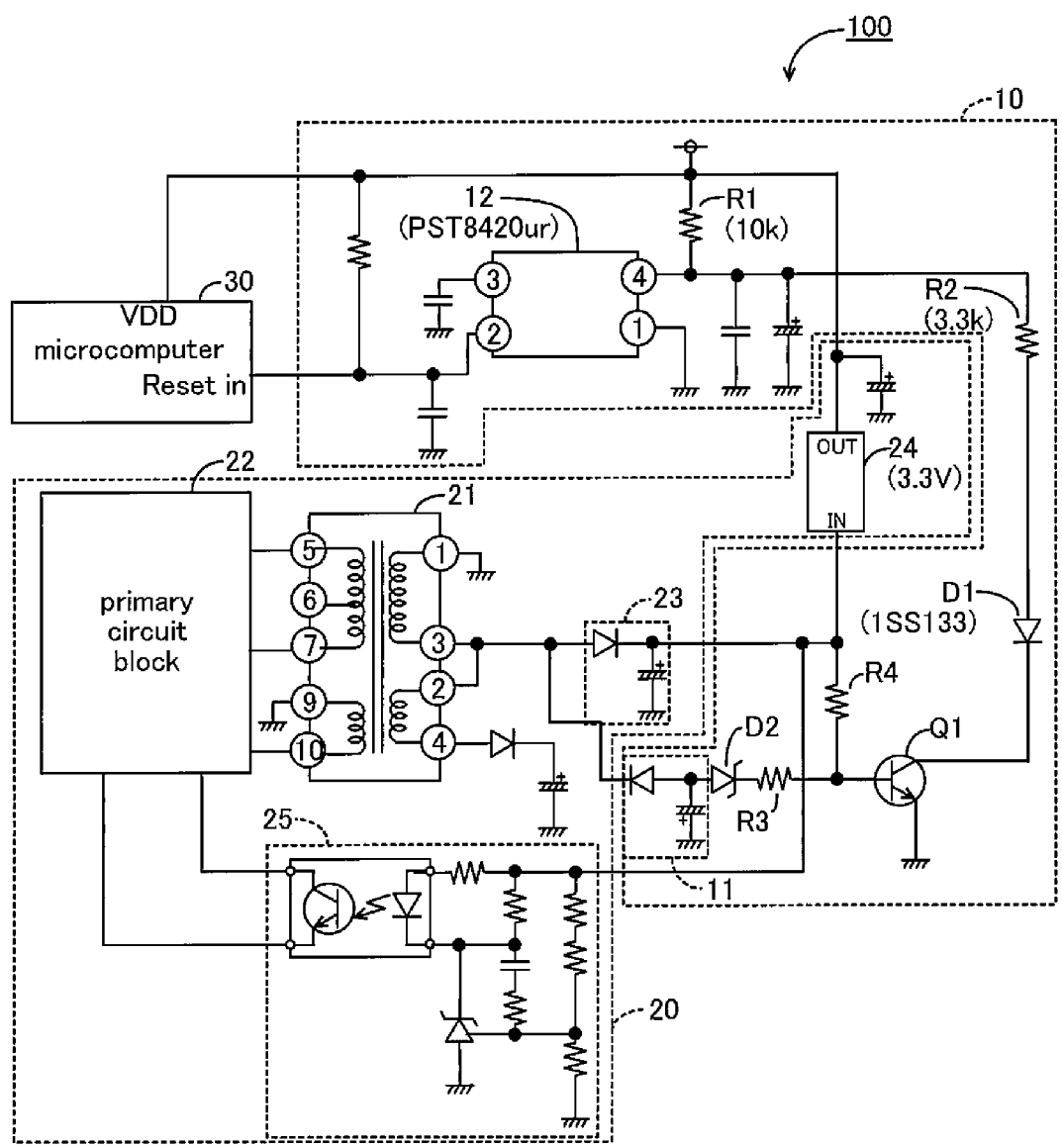
FIG. 1 is a circuit diagram showing a main structure of an electronic device having a reset circuit.

FIG. 1 is a circuit diagram showing a main structure of an electronic device having a reset circuit. As shown in FIG. 1, an electronic device includes a reset circuit 10, power circuit 20, and a microcomputer 30. The microcomputer 30 is driven by a constant voltage 3.3V (VDD) that is supplied from the power circuit 20. The reset circuit 10 is connected to a reset terminal of the microcomputer 30 that is shown as "Reset in" in the figure. The reset circuit 10 can switch the microcomputer 30 to reset state by inputting a reset signal to the reset terminal.

The power circuit 20 is constructed as a switching power circuit. The power circuit 20 includes a switching transformer 21, a primary circuit block 22, a rectifier circuit 23, a regulator 24, and a feedback circuit 25. The primary circuit block 22 is supplied power from a commercial AC (alternating current) power source for example, and generates a DC (direct current) voltage by rectifying and smoothing the AC power using a rectifier bridge circuit and a smoothing condenser. In addition, the primary circuit block 22 causes a current to flow between a terminal 5 and a terminal 7 of a primary winding of the switching transformer 21 by applying the DC voltage to the terminal 5. The primary circuit block 22 causes an AC voltage on a secondary winding of the switching transformer 21 by controlling ON/OFF of the DC voltage applied to the primary winding. Such an ON/OFF control can be achieved by a PWM (pulse width modulation) control, for example.

The rectifier circuit 23 generates a positive rectified voltage (V+) by rectifying and smoothing the AC voltage generated at a terminal 3 of the secondary winding of the switching transformer 21. The rectified voltage (V+) corresponds to the first rectified voltage in the present embodiment. The regulator 24 regulates the rectified voltage (V+) and outputs a constant voltage (e.g. 3.3V as shown in the figure). The constant voltage generated as explained above is supplied to the microcomputer 30 as a drive voltage.

The feedback circuit 25 feeds back the rectified voltage (V+) to the primary circuit block 22. When the rectified voltage (V+) doesn't exceed a predetermined value, the feedback circuit 25 shown in FIG. 1 doesn't input a feedback signal to the primary circuit block 22 because a shunt regulator is turned off and a photocoupler stops emitting light. On the other hand, when the rectified voltage (V+) exceeds the predetermined value, the feedback circuit 25 inputs the feedback signal to the primary circuit block 22 because the shunt regulator is turned on and the photocoupler emits light.

If the feedback signal is input from the feedback circuit 25, the primary circuit block 22 reduces the output voltage of the switching transformer 21 by increasing the ratio of ON time in the PWM control, for example. If the feedback signal is not input from the feedback circuit 25, the primary circuit block 22 increases the output voltage of the switching transformer 21 by reducing the ratio of ON time in the PWM control, for example. By using the feedback control described above, the output voltage of the switching transformer 21 can be controlled so that the rectified voltage (V+) converges to a constant value.

The reset circuit 10 includes a negative rectifier circuit 11, resistors R1, R2, R3 and R4, a diode D1, a Zener diode D2, a reset IC 12, and an NPN type transistor Q1. The negative rectifier circuit 11 generates a rectified voltage (V−) by rectifying and smoothing the negative side of the output of the AC voltage generated at the terminal 3 of the secondary winding of the switching transformer 21. The resistor R1 corresponds to the first resistor, a resistor R2 corresponds to the second resistor, the resistor R3 corresponds to the third resistor, the resistor R4 corresponds to the fourth resistor, and the rectified voltage (V−) corresponds to the second rectified voltage in the present embodiment.

Figure 2:
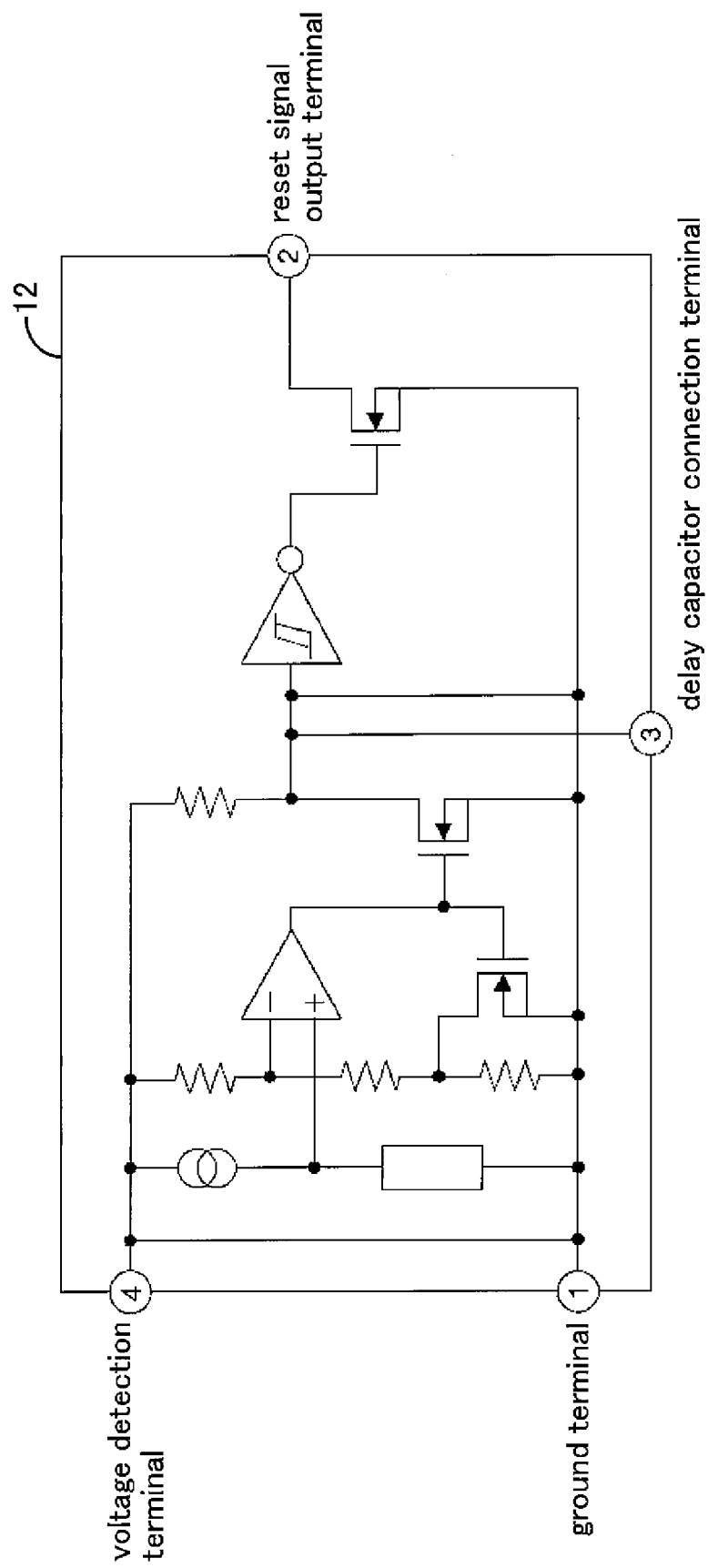
FIG. 2 is an example of a detailed structure of a reset IC.

The reset IC 12 includes terminals 1 to 4. FIG. 2 is an example of the reset IC 12. As shown in FIG. 2, a terminal 1 corresponds to the ground terminal, a terminal 2 corresponds to the reset signal output terminal, a terminal 3 corresponds to the delay capacitor connection terminal, and a terminal 4 corresponds to the voltage detection terminal The terminal 1 is connected to the ground, the terminal 2 is connected to the reset terminal of the microcomputer 30, the terminal 3 is connected to the ground through a condenser, and the terminal 4 inputs the constant voltage output from the regulator 24 through the resistor R1. In addition, the terminal 4 is connected to a collector of the transistor Q1 through the resistor R2 and the diode D1 which are connected in series.

Concerning the transistor Q1, an emitter is connected to the ground, and a base is connected to the rectifier circuit 23 through the resistor R4. In addition, the base of the transistor Q1 is also connected to the negative rectifier circuit 11 through the resistor R3 and the Zener diode D2 which are connected in series. Concerning the Zener diode D2, an anode is connected towards the negative rectifier circuit 11 and a cathode is connected towards the transistor Q1. In other words, a transmission line of the rectified voltage (V+) is connected to a transmission line of the rectified voltage (V−) through the resistors R4, R3 and the Zener diode D2 which are connected in series. The base of the transistor Q1 is pulled up to the rectified voltage (V+) through the resistor R4 when the Zener diode D2 doesn't break down. On the other hand, when the Zener diode D2 breaks down, a difference voltage between the rectified voltage (V+) and the rectified voltage (V−) is divided by the resistors R4 and R3, and then the divided voltage is input to the base of the transistor Q1.

A Zener voltage of the Zener diode D2 is specified to break down when the output of the power circuit 20 is in a normal state and not to break down when the output of the power circuit 20 is a reduced voltage state. Therefore, the Zener diode breaks down by the difference voltage between the rectified voltage (V+) and the rectified voltage (V−) when the AC voltage is input in the normal state. On the other hand, the Zener diode doesn't break down by the difference voltage between the rectified voltage (V+) and the rectified voltage (V−) when the AC voltage is input in the reduced voltage state. For example, the normal state is when the AC voltage input to the primary block 22 is higher than 70V, and the reduced voltage state is when the input AC voltage is 70V or lower.

Resistance values of the resistors R4 and R3 are specified so that the transistor Q1 is not turned on by the divided voltage that is divided from the difference voltage between the rectified voltage (V+) and the rectified voltage (V−) by the resistors R4 and R3 when the Zener diode Q2 breaks down. Therefore, when the output of the power circuit 20 is in the normal state, the Zener diode D2 breaks down and the transistor Q1 is not turned on because the necessary voltage to turn on the transistor Q1 is not input to the base of the transistor Q1. When the output of the power circuit 20 is in the reduced voltage state, the Zener diode doesn't break down and the transistor Q1 is turned on because the necessary voltage to turn on the transistor Q1 is input to the base of the transistor Q1.

If the transistor Q1 is turned on, the transfer line of the constant voltage output from the regulator 24 is connected to the ground through the resistors R1, R2 and the diode D1. When the transistor Q1 is turned off, the terminal 4 of the reset IC 12 is pulled up to the transfer line of the constant voltage by the resistor R1. On the other hand, when the transistor Q1 is turned on, the constant voltage is divided by the resistors R1 and R2 and the divided voltage is input to the terminal 4 of the reset IC 12.

Resistance values of the resistors R1 and R2 are specified so that the divided voltage generated when the transistor Q1 is turned on is to be lower than a first threshold value and higher than a second threshold value (the first threshold value > the second threshold value >0). The reset IC 12 outputs the output signal from the terminal 2 when the voltage input to the terminal 2 is lower than the first threshold value and equal to or higher than the second threshold value. The reset IC 12 cannot be controlled when the voltage input to the terminal 2 is lower than the second threshold value because the terminal 2 is opened. If the resistor 2 is not installed in the circuit, the reset IC 12 cannot be controlled and the reset signal cannot be output from the terminal 2 because the terminal 4 of the reset IC 12 is pulled down to 0.6V in a situation where only the diode D1 is installed. In other words, by installing the resistor R2 in the circuit, the voltage at the terminal 4 of the reset IC 12 can be set correctly based on the division ratio of the resistors R1 and R2 not to fall below the necessary voltage to control the reset IC 12 correctly.

Therefore, when the transistor Q1 is turned off, the reset IC 12 doesn't output the reset signal from the terminal 2. On the other hand, when the transistor Q1 is turned on, the reset IC 12 outputs the reset signal from the terminal 2. In other words, when the power circuit 20 is in the normal state, the reset IC 12 doesn't output the reset signal. On the other hand, when the power circuit 20 is in the reduced voltage state, the reset IC outputs the reset signal to switch the microcomputer 30 to the reset state. As explained above, the reset circuit 10 in the present invention can surely let the reset IC 12 reset the microcomputer 30 by surely detecting the reduced voltage state based on the rectified voltage (V+) and the rectified voltage (V−) and inputting the voltage to the terminal 4 (voltage detection terminal) of the reset IC 12 to output the reset signal.

In addition, the reset IC 12 includes a delay circuit to smooth the input of the terminal 4 by a time constant specified by the condenser connected to the terminal 3. In other words, the delay circuit can delay the timing when the terminal 2 outputs the reset signal. Therefore, even when chattering occurs while power supply of the AC input to the device is reduced, chattering doesn't occur in the reset signal output from the reset IC 12 because the reset IC 12 absorbs the influence of the chattering in the AC input.

Note that, this invention is not limited to the above-mentioned embodiments. Although it is to those skilled in the art, the following are disclosed as the one embodiment of this invention.

Mutually substitutable members, configurations, etc. disclosed in the embodiment can be used with their combination altered appropriately.

Although not disclosed in the embodiment, members, configurations, etc. that belong to the known technology and can be substituted with the members, the configurations, etc. disclosed in the embodiment can be appropriately substituted or are used by altering their combination.

Although not disclosed in the embodiment, members, configurations, etc. that those skilled in the art can consider as substitutions of the members, the configurations, etc. disclosed in the embodiment are substituted with the above mentioned appropriately or are used by altering its combination.

While the invention has been particularly shown and described with respect to preferred embodiments thereof, it should be understood by those skilled in the art that the foregoing and other changes in form and detail may be made therein without departing from the spirit and scope of the invention as defined in the appended claims.

What is claimed is:

1. A reset circuit of a microcomputer to which a drive voltage is supplied from a switching power circuit that executes feedback control to stabilize a positive first rectified voltage generated by rectifying an output voltage of a switching transformer, comprising:

a reset IC (Integrated Circuit) that has:
    a reset signal output terminal that is connected to a reset terminal of the microcomputer that is driven by a constant voltage generated by regulating the first rectified voltage by a regulator, and
    a voltage detection terminal that inputs the constant voltage thorough a first register,
and outputs a reset signal to the microcomputer when an input voltage input to the voltage detection terminal is lower than a predetermined value,
an NPN type transistor in which a collector is connected to the voltage detection terminal through a second resistor and an emitter is connected to the ground, and the transistor is turned on when an output voltage of the switching transformer is lower than a predetermined level, wherein
the voltage lower than the predetermined value is input to the voltage detection terminal when the transistor is turned on, and the voltage equal to or higher than the predetermined value is input to the voltage detection terminal when the transistor is turned off.

2. The reset circuit according to claim 1, further comprising:

a rectifier circuit that generates a second rectified voltage by rectifying a negative side of the output voltage of the switching transformer,
a Zener diode in which the second rectified voltage is input to an anode and a cathode is connected to a base of the transistor thorough a third resistor, and
a fourth register that is connected between the base of the transistor and a transfer line of the first rectified voltage, wherein
the Zener diode breaks down when the output voltage of the switching transformer is equal to or higher than the predetermined level, and the Zener diode doesn't break down when the output voltage of the switching transformer is lower than the predetermined level, and
a voltage that can turn on the transistor is input to the base of the transistor when the Zener diode doesn't break down.

3. The reset circuit according to claim 1, wherein:
the reset IC has a delay circuit that delays the timing to output the reset signal from the reset signal output terminal.

* * * * *